US008683287B2

(12) United States Patent
Tokoro et al.

(10) Patent No.: US 8,683,287 B2
(45) Date of Patent: Mar. 25, 2014

(54) ERROR CORRECTING DECODER AND RECEIVING SYSTEM

(75) Inventors: Kenichi Tokoro, Kamakura (JP); Masami Aizawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 13/231,074

(22) Filed: Sep. 13, 2011

(65) Prior Publication Data

US 2012/0210191 A1    Aug. 16, 2012

(30) Foreign Application Priority Data

Feb. 15, 2011    (JP) .................................. 2011-30105

(51) Int. Cl.
*H03M 13/00*    (2006.01)

(52) U.S. Cl.
USPC ............................ 714/753; 714/756; 714/790

(58) Field of Classification Search
USPC ........................... 714/753, 756, 755, 760, 795
See application file for complete search history.

(56) References Cited

U.S. PATENT DOCUMENTS

| 4,918,694 | A | * | 4/1990 | Preissler ........................ 714/755 |
| 5,325,371 | A | * | 6/1994 | Maeda et al. .................. 714/756 |
| 5,745,506 | A | * | 4/1998 | Yamashita et al. ............ 714/760 |
| 7,107,513 | B1 | * | 9/2006 | Yamauchi ...................... 714/795 |

FOREIGN PATENT DOCUMENTS

| JP | 2009-200732 | 9/2009 |
| WO | 2011083773 A1 | 7/2011 |

OTHER PUBLICATIONS

Japanese Office Action issued on May 28, 2013 to the Japanese Application No. 2011-030105 and an English translation thereof.

* cited by examiner

*Primary Examiner* — Fritz Alphonse
(74) *Attorney, Agent, or Firm* — White & Case LLP

(57) ABSTRACT

According to one embodiment, an error correcting decoder includes a first error correction decoding module, an interleaving module, a delay module, a second error correction decoding module, and a corrector. The first error correction decoding module performs a first error correction decoding to a received signal in accordance with a broadcasting system. The interleaving module rearranges a data array of an output of the first error correction decoding module in a second order. The data array is ordered in a first order which is reverse to the second order. The delay module delays the received signal by a processing time of the first error correction decoding module. The second error correction decoding module performs a second error correction decoding to an output of the interleaving module and an output of the delay module. The corrector configured to correct a delay of an output of the second error correction decoding module based on a packet position defined by the broadcasting system.

20 Claims, 9 Drawing Sheets

| CARRIER MODULATION | CONVOLUTION CODING RATIO | DELAY CORRECTION AMOUNT [TS] | | |
|---|---|---|---|---|
| | | MODE 1 | MODE 2 | MODE 3 |
| QPSK OR DPSK | 1/2 | 12×N−11 | 24×N−11 | 48×N−11 |
| | 2/3 | 16×N−11 | 32×N−11 | 64×N−11 |
| | 3/4 | 18×N−11 | 36×N−11 | 72×N−11 |
| | 5/6 | 20×N−11 | 40×N−11 | 80×N−11 |
| | 7/8 | 21×N−11 | 42×N−11 | 84×N−11 |
| 16QAM | 1/2 | 24×N−11 | 48×N−11 | 96×N−11 |
| | 2/3 | 32×N−11 | 64×N−11 | 128×N−11 |
| | 3/4 | 36×N−11 | 72×N−11 | 144×N−11 |
| | 5/6 | 40×N−11 | 80×N−11 | 160×N−11 |
| | 7/8 | 42×N−11 | 84×N−11 | 168×N−11 |
| 64QAM | 1/2 | 36×N−11 | 72×N−11 | 144×N−11 |
| | 2/3 | 48×N−11 | 96×N−11 | 192×N−11 |
| | 3/4 | 54×N−11 | 108×N−11 | 216×N−11 |
| | 5/6 | 60×N−11 | 120×N−11 | 240×N−11 |
| | 7/8 | 63×N−11 | 126×N−11 | 252×N−11 |

| LAYER | CARRIER MODULATION | CONVOLUTION CODING RATIO | N | P | Q | R (=Q/P) | D (Rx11) |
|---|---|---|---|---|---|---|---|
| A | QPSK | 1/2 | 1 | 48 | 4608 | 96 | 1056 |
| B | 64QAM | 7/8 | 12 | 3024 | 4608 | 1.5 | 17 |

FIG. 10

| THE NUMBER OF TSP PER ONE MULTIPLE FRAME [P] | | | | | |
|---|---|---|---|---|---|
| TRANSMISSION MODE | GUARD INTERVAL RATIO [G] | | | | |
| | 1/2 | 1/4 | 1/8 | 1/16 | 1/32 |
| MODE 1 | 1280 | 1152 | 1088 | 1056 | |
| MODE 2 | 2560 | 2304 | 2176 | 2112 | |
| MODE 3 | 5120 | 4608 | 4352 | 4224 | |

US 8,683,287 B2

ERROR CORRECTING DECODER AND RECEIVING SYSTEM

CROSS REFERENCE TO RELATED APPLICATION(S)

This application is based upon and claims the benefit of priority from the prior Japanese Patent Application No. 2011-030105, filed on Feb. 15, 2011, the entire contents of which are incorporated herein by reference.

FIELD

Embodiments described herein relate generally to an error correcting decoder and a receiving system.

BACKGROUND

With introducing digital terrestrial television broadcasting, a receiving system conforming to the digital terrestrial television broadcasting becomes widespread. An iterative decoding method is well known as a method for decoding a signal transmitted in conformity to a digital terrestrial television broadcasting standard such as an integrated service digital broadcasting terrestrial (ISDB-T) standard. The conventional receiving system includes an error correcting decoder that performs the iterative decoding method.

However, in the conventional iterative decoding method, a data array in an output (Transport Stream (TS)) of the error correcting decoder is unconsidered. Originally, in the broadcasting standard of the digital terrestrial television broadcasting, there is a rule for data sequence after decoding processing. Therefore, in the case that the data array of the output (TS) of the error correcting decoder differs from the data array of TS generated by a base station of the digital terrestrial television broadcasting, a Program Clock Reference (PCR) jitter occurs when the output (TS) of the error correcting decoder is decoded. As a result, for example, a phenomenon (what is called a deviation in lip synch) in which a human voice deviates from a movement of a lip occurs in a video image of a television set.

That is, in the conventional iterative decoding method, quality of a decoding result is degraded due to a problem occurred by decoding the output (TS) of the error correcting decoder.

BRIEF DESCRIPTION OF THE DRAWINGS

FIG. 8 illustrates a relationship between a convolution coding ratio in each carrier modulation and a delay correction amount associated with the byte interleaving in each transmission mode.

FIG. 9 illustrates an interleaved delay of two-layer (A layer and B layer) transmission, in which the transmission mode is MODE3 and a guard interval ratio is 1/8.

FIG. 10 illustrates the guard interval ratio in each transmission mode and the number of TSPs (P) included in one multiple frame.

DETAILED DESCRIPTION

Figure 1:
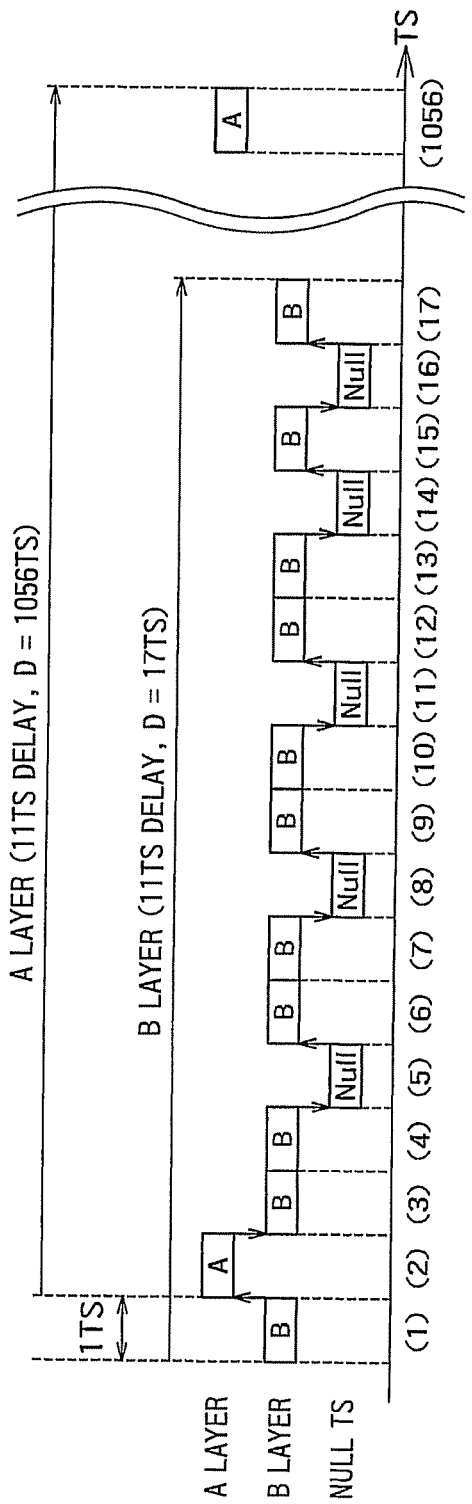
FIG. 1 is a view illustrating the TS delay caused by the interleaving.

Embodiments will now be explained with reference to the accompanying drawings.

In general, according to one embodiment, an error correcting decoder includes a first error correction decoding module, an interleaving module, a delay module, a second error correction decoding module, and a corrector. The first error correction decoding module performs a first error correction decoding to a received signal in accordance with a broadcasting system. The interleaving module rearranges a data array of an output of the first error correction decoding module in a second order. The data array is ordered in a first order which is reverse to the second order. The delay module delays the received signal by a processing time of the first error correction decoding module. The second error correction decoding module performs a second error correction decoding to an output of the interleaving module and an output of the delay module. The corrector configured to correct a delay of an output of the second error correction decoding module based on a packet position defined by the broadcasting system.

A TS delay caused by interleaving will be described.

In an iterative decoding method, interleaving processing and de-interleaving processing are iteratively performed. The interleaving processing and the de-interleaving processing are generally referred to as byte interleaving. In the ISDB-T standard, a delay correction is performed in association with the byte interleaving. A component of the delay correction is inserted into a transmission side in order to equalize a delay time of transmission to a delay time of reception in each layer.

FIG. 8 illustrates a relationship between a convolution coding ratio in each carrier modulation and a delay correction amount associated with the byte interleaving in each transmission mode. The delay correction amount in each layer is set such that the total delay (delay of 11 TS) including a transmission delay and a reception delay caused by the byte interleaving becomes equal to one frame. In the case that the layers differ from one another in a bit rate, the layers differ from one another in a converted amount in which the transmission TS delay (delay of 11 TS) caused by the byte interleaving is converted into a transmission delay time. The delay correction corresponding to the transmission bit rate is performed in order to compensate this phenomenon.

For example, in the case that a carrier modulation mode is a Quadrature Phase Shift Keying (QPSK), a convolution coding ratio is 1/2, and the transmission mode is MODE1, the delay correction amount is 12×N−11 (N is the number of segments used in the layer). Assuming that the number of segments N is 1, the delay correction amount is 1 (=12−11) TS.

For example, in the case that the carrier modulation system is a Quadrature Amplitude Modulation (hereinafter referred to as a QAM), the convolution coding ratio is 7/8, and the transmission mode is MODE3, the delay correction amount is 252×N−11. Assuming that the number of segments N is 1, the delay correction amount is 241 (=252−11) TS. Assuming that the number of segments N is the maximum of 13, the delay correction amount is 3265 (3276−11) TS.

A memory of 3265 TS is required for the delay correction. For example, in the layer transmission of MODE3, the delay correction amounts in an A layer (the carrier modulation system is the QPSK, the convolution coding ratio is 1/2, and the number of segments N is 1), a B layer (the carrier modulation system is the 16 QAM, the convolution coding ratio is 3/4, and the number of segments N is 5), and a C layer (the carrier modulation system is the 64 QAM, the convolution coding ratio is 7/8, and the number of segments N is 7) are obtained as follows. The memory of 37 TS is required for the delay correction in the A layer, the memory of 709 TS is required for the delay correction in the B layer, and the memory of 1753 TS is required for the delay correction in the C layer.

Delay correction amount in $A$ layer=48−11=37 TS

Delay correction amount in $B$ layer=144×5−11=709 TS

Delay correction amount in $C$ layer=252×7−11=1753 TS

The TS delay caused by the interleaving will be described. FIG. 1 is a view illustrating the TS delay caused by the interleaving. FIG. 9 illustrates an interleaved delay of two-layer (A layer and B layer) transmission, in which the transmission mode is MODE3 and a guard interval ratio is 1/8. In FIG. 9, P is the number of Transport Stream Packets (TSPs) per frame, Q is the number of TSPs included in a multiple frame, R is a transmission TSP interval, and D is the delay correction amount. FIG. 10 illustrates the guard interval ratio in each transmission mode and the number of TSPs (P) included in one multiple frame.

In the A layer, the number of TSPs (P) per frame is 48 TS, the number of TSPs (Q) included in one frame is 4608 TS, and the transmission TSP interval (R) is 96 (=4608 TS/48 TS) TS. That is, the data in the A layer is supplied at 96-TS intervals. Because 11 TS is required for the interleaving processing, the delay correction amount (D) of 1056 TS (=96×11) is required for the A layer.

In the B layer, the number of TSPs (P) per frame is 3024 TS, the number of TSPs (Q) included in one frame is 4608 TS, and the transmission TSP interval (R) is 1.5 (≈4608/3024) TS. That is, the data in the B layer is supplied at 1.5 TS intervals. Because 11 TS is required for the interleaving processing, the delay correction amount (D) of 17 (≈1.5×11) TS is required for the B layer.

As illustrated in FIG. 1, the delay correction amount (1056 TS) in the A layer is increased longer than the delay correction amount (17 TS) in the B layer by the interleaving. A null TS is provided between the A layer and the B layer.

As illustrated in FIG. 8, the delay correction amount in the A layer is 37 (=48×1−11) TS, and the delay correction amount in the B layer is 3013 (=252×12−11) TS.

In the A layer, the transmission delay of the previous interleaving is 1056 TS, and the transmission delay of the delay correction amount is 3552 (=37×96) TS. The sum of the two transmission delays is 4608 (=1056+3552) TS. In the B layer, the transmission delay of the previous interleaving is 17 TS, and the transmission delay of the delay correction amount is 4591 (≈3013×1.5) TS. The sum of the two transmission delays is 4608 (=17+4591) TS. That is, in the A layer and the B layer, the sum of the transmission delays is matched with the number of TSPs per frame (see FIG. 9). Therefore, it is found that the delay of one frame is generated by the delay correction.

Figure 2:
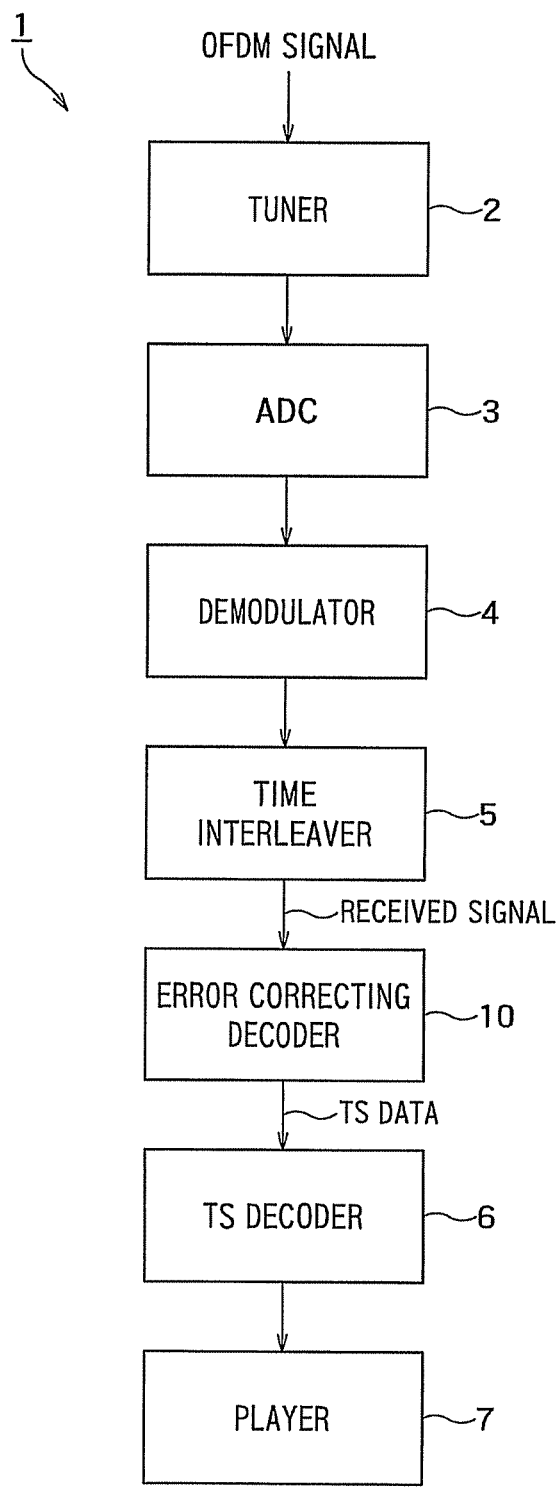
FIG. 2 is a block diagram of the receiving system of the embodiment.

A receiving system according to an embodiment of the invention will be described below. FIG. 2 is a block diagram of the receiving system of the embodiment.

A receiving system 1 receives an Orthogonal Frequency Division Multiplexing (OFOM) signal transmitted in a layer transmission manner from a base station, and reproduces a video image based on the received OFDM signal. The receiving system 1 includes a tuner 2, an Analog to Digital Converter (hereinafter referred to as an ADC) 3, a demodulator 4, a time interleaver 5, an error correcting decoder 10, a TS decoder 6, and a player 7.

The tuner receives the OFDM signal transmitted in the layer transmission manner from the base station for the digital terrestrial television broadcasting. The ADC 3 converts an output of the tuner 2 into a digital signal. The demodulator 4 demodulates the output of the ADC 3. The time interleaver 5 performs time-interleaving processing to the output of the demodulator 4. The output (received signal) of the time interleaver 5 is supplied to the error correcting decoder 10. The received signal is a signal in accordance with a broadcasting system which is employed by the base station.

The error correcting decoder 10 generates TS data by performing error correction processing plural times to the output (received signal) of the time interleaver 5. That is, the iterative decoding system is adopted in the error correcting decoder 10. The output (TS data) of the error correcting decoder 10 is supplied to the TS decoder 6.

The TS decoder 6 decodes the output (TS data) of the error correcting decoder 10. For example, the TS decoder 6 is a MPEG2 (Moving Picture Experts Group phase 2) decoder or an H.264 decoder. The player 7 reproduces the video image corresponding to the OFDM signal based on the output of the TS decoder 6. For example, the player 7 is a liquid crystal television set.

An example of the error correcting decoder 10 that performs the error correction decoding twice will be described below. However, the embodiment can also be applied to the error correcting decoder that performs the error correction decoding three times or more.

(First Embodiment)

Figure 3:
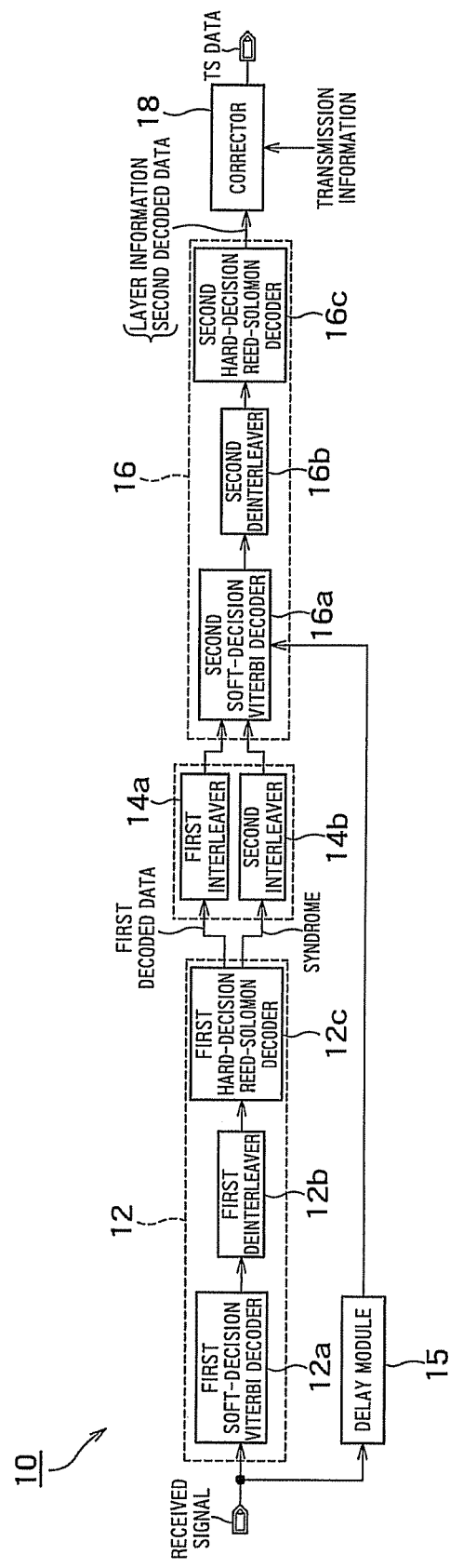
FIG. 3 is a block diagram of an error correcting decoder 10 of the first embodiment.

An error correcting decoder according to a first embodiment will be described. FIG. 3 is a block diagram of an error correcting decoder 10 of the first embodiment.

The error correcting decoder 10 generates the TS data by performing the error correction processing twice to the received signal. The error correcting decoder 10 includes a first error correction decoding module 12, an interleaving module 14, a delay module 15, a second error correction decoding module 16, and a corrector 18.

The first error correction decoding module 12 performs the first error correction processing to the received signal. The first error correction decoding module 12 includes a first soft-decision Viterbi decoder 12a, a first deinterleaver 12b, and a first hard-decision Reed-Solomon decoder 12c.

The first soft-decision Viterbi decoder 12a performs convolution decoding to the received signal. The output of the first soft-decision Viterbi decoder 12a is supplied to the first deinterleaver 12b.

The first deinterleaver 12b rearranges the data array of outputs of the first soft-decision Viterbi decoder 12a in a predetermined first order. The output of the first deinterleaver 12b is supplied to the first hard-decision Reed-Solomon decoder 12c.

The first hard-decision Reed-Solomon decoder 12c performs hard-decision Reed-Solomon decoding to the output of the first deinterleaver 12b to generate first decoded data and a syndrome. The syndrome is a signal indicating correction reliability of the first decoded data. The output (first decoded data and syndrome) of the first hard-decision Reed-Solomon decoder 12c is supplied to the interleaving module 14.

The interleaving module 14 rearranges the data array of outputs of the first error correction decoding module 12 by a second method. In the second method, the data array is rearranged in a second order which is reverse to the first order. The interleaving module 14 includes a first interleaver 14a and a second interleaver 14b.

The first interleaver 14a rearranges the data array of outputs (first decoded data) of the first hard-decision Reed-Solomon decoder 12c in the second order. The output of the first interleaver 14a is supplied to the second error correction decoding module 16.

The second interleaver 14b rearranges the data array of outputs (syndrome) of the first hard-decision Reed-Solomon decoder 12c in the second order. The output of the second interleaver 14b is supplied to the second error correction decoding module 16.

The delay module 15 is a delay element that delays the received signal. The output of the delay module 15 is supplied to the second error correction decoding module 16.

The second error correction decoding module 16 performs the second error correction processing to the output of the interleaving module 14 and the output of the delay module 15. The second error correction decoding module 16 includes a second soft-decision Viterbi decoder 16a, a second deinterleaver 16b, and a second hard-decision Reed-Solomon decoder 16c.

The second soft-decision Viterbi decoder 16a performs the convolution decoding to the outputs of the first interleaver 14a, the second interleaver 14b, and the delay module 15. The output of the second soft-decision Viterbi decoder 16a is supplied to the second deinterleaver 16b.

The second deinterleaver 16b rearranges the data array of outputs of the second soft-decision Viterbi decoder 16a in the second order. The output of the second deinterleaver 16b is supplied to the second hard-decision Reed-Solomon decoder 16c.

The second hard-decision Reed-Solomon decoder 16c generates second decoded data by performing hard-decision Reed-Solomon decoding to the output of the second deinterleaver 16b. The output of the second hard-decision Reed-Solomon decoder 16c is supplied to the corrector 18.

The corrector 18 performs the delay correction in accordance with the byte interleaving to the output of the second hard-decision Reed-Solomon decoder 16c based on a packet position defined by the broadcasting system of the base station.

Figure 4:
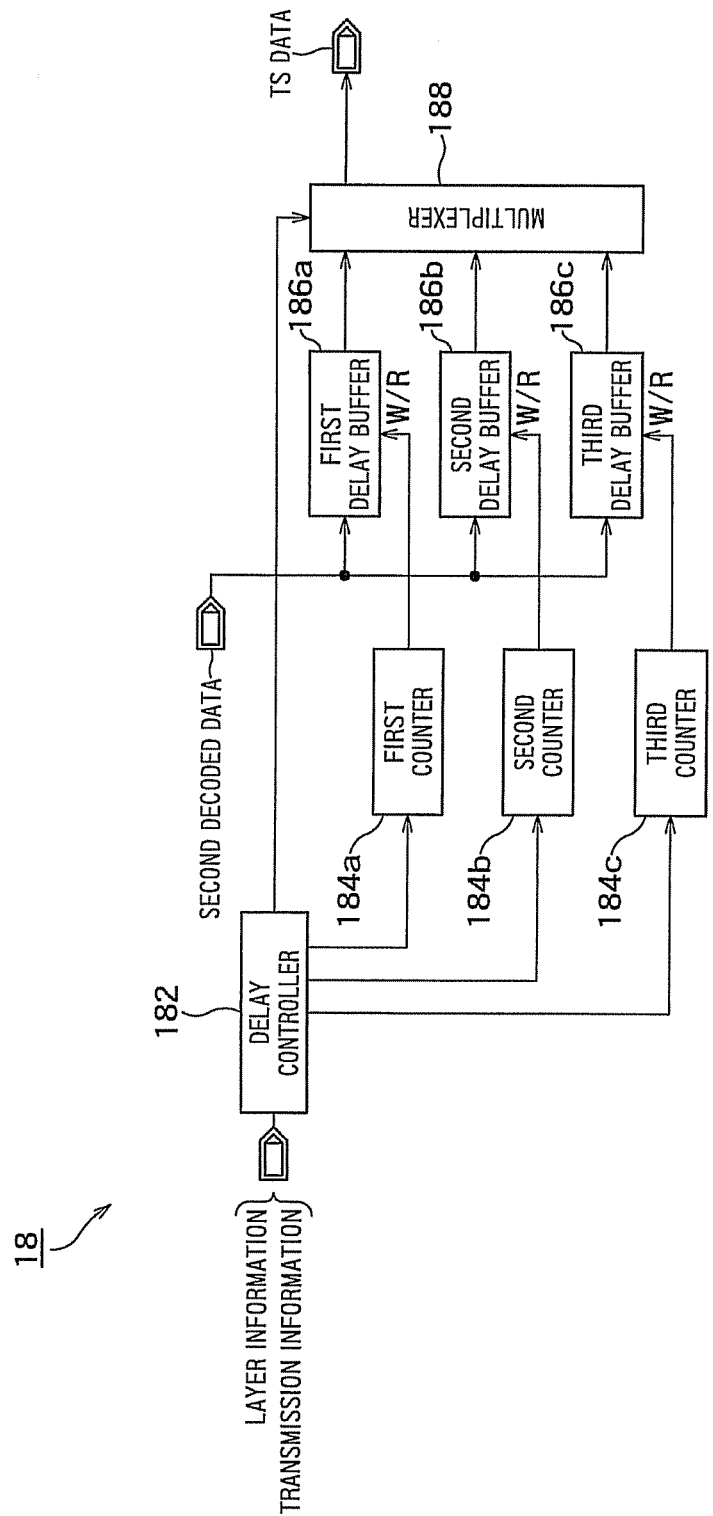
FIG. 4 is a block diagram of the corrector 18 of the first embodiment.

The corrector of the first embodiment will be described. FIG. 4 is a block diagram of the corrector 18 of the first embodiment.

The corrector 18 includes a delay controller 182, a first counter 184a to a third counter 184c, a first delay buffer 186a to a third delay buffer 186c, and a multiplexer 188.

The delay controller 182 generates a control signal to control the first counter 184a to the third counter 184c and the multiplexer 188, based on transmission information and layer information. The transmission information is supplied from the base station. The transmission information includes the carrier modulation system, the convolution coding ratio, the number of segments, the transmission mode, and the guard interval ratio. The layer information is supplied from the second hard-decision Reed-Solomon decoder 16c. The layer information indicates the layer of the second decoded data. The output of the delay controller 182 is supplied to the first counter 184a to the third counter 184c and the multiplexer 188.

The first counter 184a to the third counter 184c control write and read of the first delay buffer 186a to the third delay buffer 186c, respectively. The first counter 184a to the third counter 184c are operated according to the control signal generated by the delay controller 182. The first counter 184a to the third counter 184c generates a write address W to write the second decoded data in the first delay buffer 186a to the third delay buffer 186c, respectively. Also, the first counter 184a to the third counter 184c generates a read address R to read the second decoded data retained in the first delay buffer 186a to the third delay buffer 186c, respectively. Also, the first counter 184a to the third counter 184c outputs the generated write address W and read address R to the first delay buffer 186a to the third delay buffer 186c, respectively.

The first delay buffer 186a to the third delay buffer 186c delay the second decoded data in the A layer to the C layer, respectively. When the write addresses Ws are supplied from the first counter 184a to the third counter 184c, the first delay buffer 186a to the third delay buffer 186c store the second decoded data in areas corresponding to the write addresses Ws, respectively. Also, when the read addresses Rs are supplied from the first counter 184a to the third counter 184c, the first delay buffer 186a to the third delay buffer 186c output the second decoded data stored in areas corresponding to the read addresses Rs to the multiplexer 188, respectively. Therefore, the second decoded data is delayed by a time since the write address W is supplied until the read address R is supplied. For example, in the case that the carrier modulation system is the 64 QAM, the convolution coding ratio is 7/8, and the transmission mode is MODE3, the capacity in which the second decoded data corresponding to 2761 (=252×13−11) TS can maximally be stored is required for each of the first delay buffer 186a to the third delay buffer 186c (see FIG. 8).

The multiplexer 188 generates the TS data by multiplexing the outputs of the first delay buffer 186a to the third delay buffer 186c in a layer order indicated by the layer information. The output (TS data) of the multiplexer 188 is supplied to the TS decoder 6 of FIG. 2.

According to the first embodiment, the corrector 18 corrects the delay of the output of the second error correction decoding module 16 based on the layer information and the transmission information, so that the PCR jitter can be reduced when the TS data is decoded. As a result, the quality of the reproduced video image is improved than the prior art.

(Second Embodiment)

A second embodiment will be described below. The second embodiment is an example of an error correcting decoder that further includes a layer controller and a layer selector in addition to the same configuration as the error correcting decoder of the first embodiment. The same description as the first embodiment is omitted.

Figure 5:
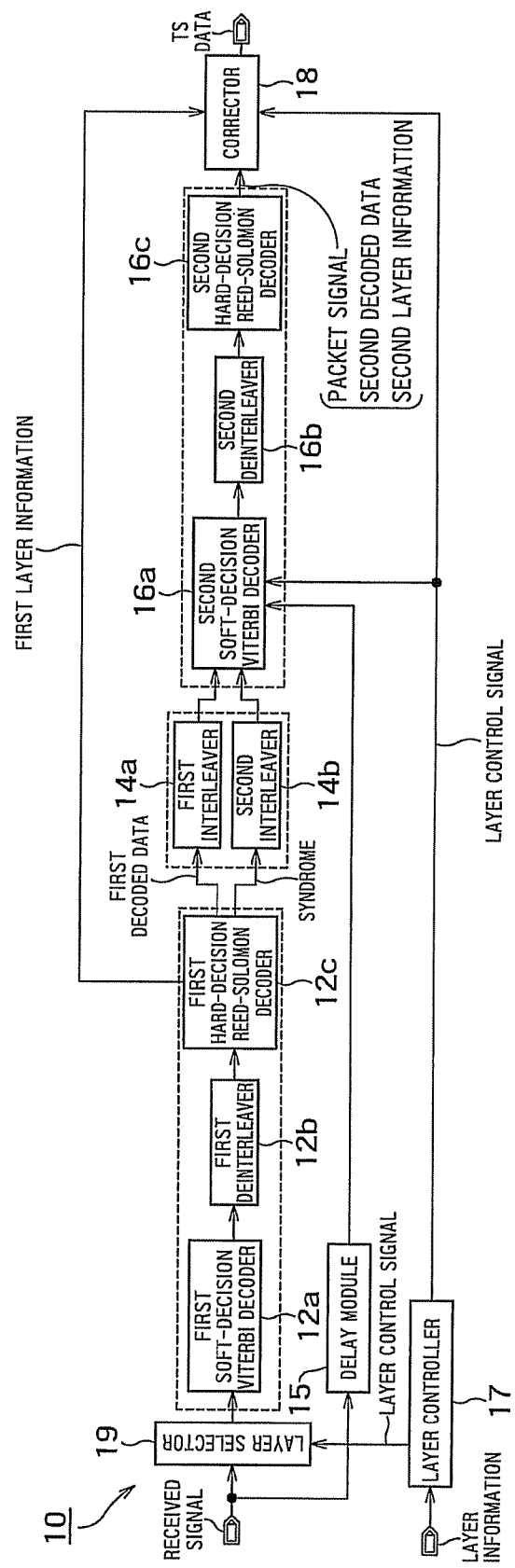
FIG. 5 is a block diagram of an error correcting decoder 10 of the second embodiment.
Figure 6:
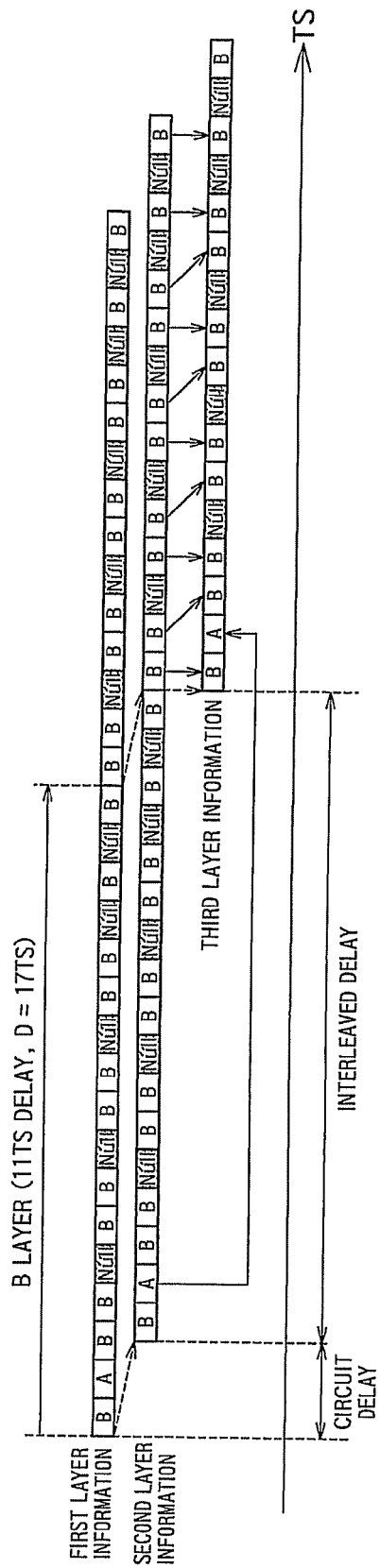
FIG. 6 is a schematic diagram of layer information of the second embodiment.

An error correcting decoder according to a second embodiment will be described. FIG. 5 is a block diagram of an error correcting decoder 10 of the second embodiment. FIG. 6 is a schematic diagram of layer information of the second embodiment.

The error correcting decoder 10 generates the TS data by performing the error correction processing twice to the two-layer (A layer and B layer) received signal. The error correcting decoder 10 includes a first error correction decoding module 12, an interleaving module 14, a delay module 15, a second error correction decoding module 16, a layer controller 17, a corrector 18, and a layer selector 19. The interleaving module 14 and the delay module 15 are identical to those of the first embodiment.

For example, the A layer is used in one-segment broadcasting, and the B layer is used in high definition (HD) broadcasting. In the A layer, the carrier modulation system is the QPSK, the convolution coding ratio is 1/2, and the number of segments is 1. In the B layer, the carrier modulation system is the 64 QAM, the convolution coding ratio is 7/8, and the number of segments is 12. Because a low carrier modulation system is adopted the A layer is suitable to weak transmission. On the other hand, because a high carrier modulation system is adopted, the B layer is suitable to transmission of large amounts of data while is not suitable to the weak transmission.

The layer controller 17 generates a layer control signal to control the layer selector 19, a second soft-decision Viterbi decoder 16a, and the corrector 18, based on the layer information. The layer information is supplied from the base station. The layer information indicates the received signal layer (A layer or B layer). The output (layer control signal) of the layer controller 17 is supplied to the layer selector 19, the second soft-decision Viterbi decoder 16a, and the corrector 18.

The layer selector 19 selects the received signal of the target layer to be supplied to the second soft-decision Viterbi decoder 16a (that is, to which the second error correction decoding should be performed), based on the output (layer control signal) of the layer controller 17. The target layer is one in which the error correction should be performed plural times. The output (received signal of target layer) of the layer selector 19 is supplied to a first soft-decision Viterbi decoder 12a.

The first error correction decoding module 12 performs the first error correction processing to the output (received signal of target layer) of the layer selector 19. The first error correction decoding module 12 includes the third soft-decision Viterbi decoder 12a, a first deinterleaver 12b, and a first hard-decision Reed-Solomon decoder 12c. The first deinterleaver 12b is identical to that of the first embodiment.

The first soft-decision Viterbi decoder 12a is performs the convolution decoding to the output (received signal of target layer) of the layer selector 19. The output of the first soft-decision Viterbi decoder 12a is supplied to the first deinterleaver 12b.

The first hard-decision Reed-Solomon decoder 12c generates the first decoded data, the syndrome, and first layer information by performing the hard-decision Reed-Solomon decoding to the output of the first deinterleaver 12b. The first layer information indicates a data array of the first decoded data (see FIG. 6). Regarding the outputs of the first hard-decision Reed-Solomon decoder 12c, the first decoded data and the syndrome are supplied to the interleaving module 14, and the first layer information is supplied to the corrector 18.

The second error correction decoding module 16 performs the second error correction processing to the outputs of the interleaving module 14 and the delay module 15. The second error correction decoding module 16 includes the second soft-decision Viterbi decoder 16a, a second deinterleaver 16b, and a second hard-decision Reed-Solomon decoder 16c. The second deinterleaver 16b is identical to that of the first embodiment.

The second soft-decision Viterbi decoder 16a performs the convolution decoding to the received signal of the target layer by a first decoding method. Also, the second soft-decision Viterbi decoder 16a performs the convolution decoding to the received signal of a non-target layer which is a layer except the target layer by a second decoding method which is different from the first decoding method. Specifically, the second soft-decision Viterbi decoder 16a distinguishes between the received signal of the target layer and the received signal of the non-target layer based on the output (layer control signal) of the layer controller 17. Then the second soft-decision Viterbi decoder 16a performs the convolution decoding to the received signal of the target layer using the first interleaver 14a, the second interleaver 14b, and the output of the delay module 15 (the first decoding method). On the other hand, the second soft-decision Viterbi decoder 16a also performs the convolution decoding to the received signal of the non-target layer using the output of the delay module 15 (the second decoding method). The output of the second soft-decision Viterbi decoder 16a is supplied to the second deinterleaver 16b.

The second hard-decision Reed-Solomon decoder 16c generates the second decoded data and second layer information by performing the hard-decision Reed-Solomon decoding to the output of the second deinterleaver 16b. The second layer information indicates a data array of the second decoded data (see FIG. 6). The output of the second hard-decision Reed-Solomon decoder 16c is supplied to the corrector 18.

As illustrated in FIG. 6, the first layer information indicates the data array of outputs (first decoded data) of the first hard-decision Reed-Solomon decoder 12c of FIG. 5. The first decoded data is delayed by about 2 TS due to circuit delays of the first interleaver 14a, the second soft-decision Viterbi decoder 16a, the second deinterleaver 16b, and the second hard-decision Reed-Solomon decoder 16c of FIG. 5. The second layer information indicates the data array of outputs (second decoded data) of the second hard-decision Reed-Solomon decoder 16c, which are delayed by about 2 TS with respect to the outputs (first decoded data) of the first hard-decision Reed-Solomon decoder 12c.

As illustrated in FIG. 6, the B layer has the interleaved delay of about 17 TS. Accordingly, it is necessary that the B layer of the first layer information be delayed by the sum (about 19 TS) of the interleaved delay (about 17 TS) in the B layer and the circuit delay (2 TS).

On the other hand, because the first layer information indicates the data array previously defined by the ISDB-T standard, it is an infringement of the rule that the first layer information is delayed by 19 TS like the second layer information. For this reason, new layer information (third layer information of FIG. 7) in which the first layer information is delayed by the sum of the interleaved delay and the circuit delay is utilized. Therefore, the delay correction is performed without the infringement of the rule.

For example, as illustrated in FIG. 6, because the A layer is delayed by 1056 TS, the A layer is delayed without iteratively performing the error correction. As illustrated in FIG. 9, because the A layer has the transmission TSP interval (R) of 96 TS, the data in the A layer retained at the timing of the second layer information may be read at the timing of the third layer information. On the other hand, as illustrated in FIG. 6, for the B layer, the first layer information is switched to the third layer information, thereby performing the delay correction.

The capacity of the buffer necessary for the delay correction in the A layer is 1 to 2 TS because it is delayed without iteratively performing the error correction in the A layer. On the other hand, the capacity of the buffer necessary for the delay correction in the B layer is several transport streams because it is delayed with only switching the first layer information to the third layer information in the B layer. Therefore, the error correction is iteratively performed only to the layer having the higher carrier modulation while the other layer is delayer without iteratively performing the error correction, which allows the capacity of the buffer necessary for the delay correction to be considerably reduced.

Recently the ISDB-T standard is also adopted in overseas countries. Assuming that three-layer (A layer to C layer) transmission is performed, it is considered that the A layer is used in partial reception, the B layer is used in mobile reception, and the C layer is used in HD broadcasting reception. In such cases, the error correction is iteratively performed only to the layer (for example, C layer) having the highest carrier modulation (that is, the number of segments is the largest of all), and other layers (for example, A layer and B layer) may be delayed without iteratively performing the error correction. For the single-layer (A layer) transmission, the error correction may iteratively be performed to the A layer.

The corrector 18 is a rearranging device that performs the delay correction associated with the byte interleaving to the output of the second hard-decision Reed-Solomon decoder 16c using the new layer information in accordance with the packet position defined by the broadcasting system of the base station.

Figure 7:
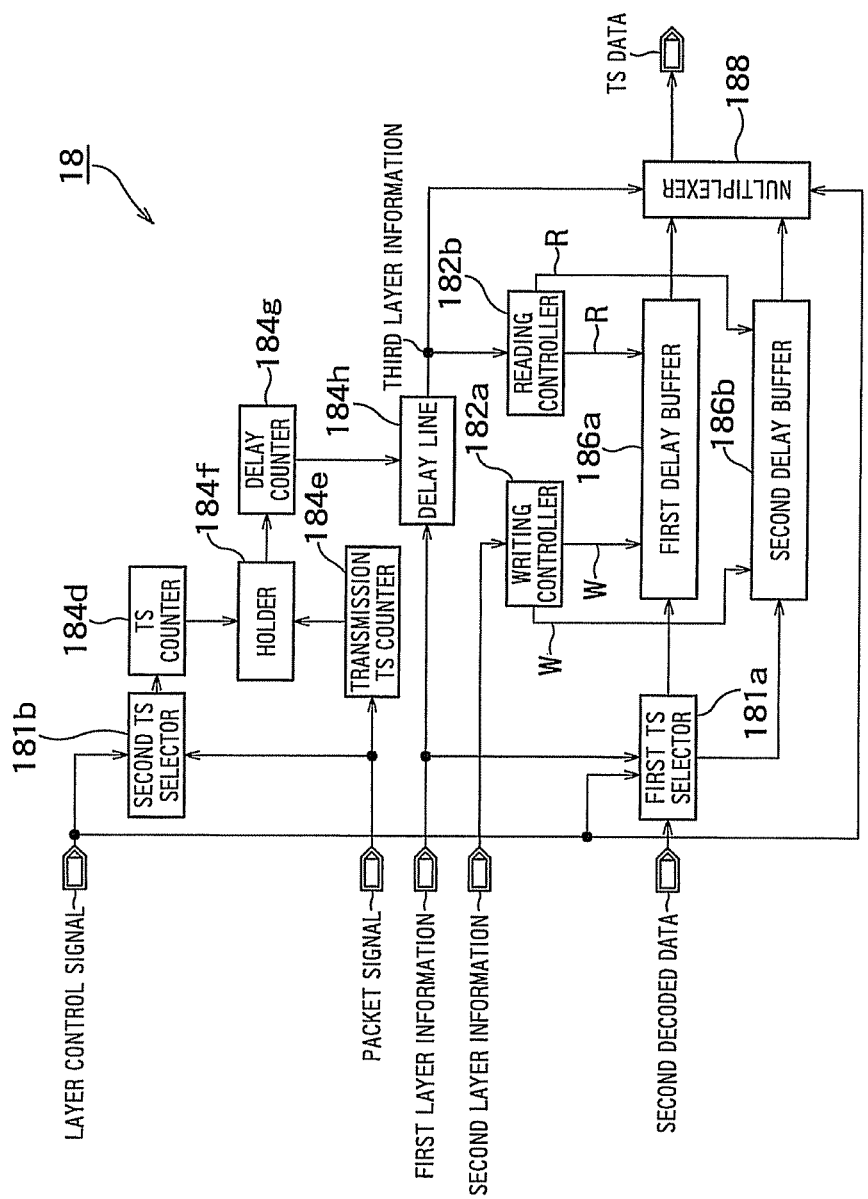
FIG. 7 is a block diagram of the corrector 18 of the second embodiment.

The corrector of the second embodiment will be described. FIG. 7 is a block diagram of the corrector 18 of the second embodiment.

The corrector 18 includes a first TS selector 181a, a second TS selector 181b, a writing controller 182a, a reading controller 182b, a TS counter 184d, a transmission TS counter 184e, a holder 184f, a delay counter 184g, a delay line 184h, a first delay buffer 186a, a second delay buffer 186b, and a multiplexer 188.

The second decoded data, the layer control signal, and the first layer information are supplied to the first TS selector 181a. The first TS selector 181a distinguishes between the second decoded data of the received signal of the target layer and the second decoded data of the received signal of the non-target layer based on the layer control signal. Also the first TS selector 181a outputs the second decoded data of the received signal of the target layer to the first delay buffer 186a while the first TS selector 181a outputs the second decoded data of the received signal of the non-target layer to the second delay buffer 186b.

The writing controller 182a generates the write address W according to the second layer information and outputs the write address W to the first delay buffer 186a and the second delay buffer 186b. Therefore, the output of the first TS selector 181a is written in the first delay buffer 186a and the second delay buffer 186b at the timing of the second layer information.

The reading controller 182a generates the read address R according to the third layer information and outputs the read address R to the first delay buffer 186a and the second delay buffer 186b. Therefore, the pieces of data retained by the first delay buffer 186a and the second delay buffer 186b are read at the timing of the third layer information.

The layer control signal and a packet signal are supplied to the second TS selector 181b. The packet signal is supplied from the second hard-decision Reed-Solomon decoder 16c. The second TS selector 181b selects the signal of the target layer in the packet signals based on the layer control signal. The output of the second TS selector 181b is supplied to the TS counter 184d.

The TS counter 184d counts the interleaved delay (11 TS) with respect to the output of the second TS selector 181b. The output of the TS counter 184d is supplied to the holder 184f.

The packet signal is supplied to the transmission TS counter 184e. In parallel with the counting of the TS counter 184d, the transmission TS counter 184e counts the number of transmission TSs of the data and the null TS in the A layer based on the packet signal. The output of the transmission TS counter 184e is supplied to the holder 184f.

The holder 184f holds the output (the number of transmission TSs of the data and the null TS in the A layer) of the transmission TS counter 184e. When the output of the second TS selector 181b reaches the interleaved delay (11 TS), the holder 184f outputs the holding value to the delay counter 184g.

The delay counter 184g counts the circuit delay (about 2 TS). The output of the delay counter 184g is supplied to the delay line 184h.

The first layer information and the output of the delay counter 184g are supplied to the delay line 184h. The delay line 184h delays the first layer information by the circuit delay (about 2 TS) to generate the third layer information. The output of the delay line 184h is supplied to the reading controller 182b and the multiplexer 188.

As illustrated in FIG. 6, the third layer information indicates that the TS data is delayed by the sum (about 19 TS) of the interleaved delay (17 TS) and the circuit delay (about 2 TS) with respect to the first decoded data.

The first delay buffer 186a and the second delay buffer 186b delay the second decoded data. The first delay buffer 186a delays the second decoded data of the received signal of the target layer. The second delay buffer 186b delays the second decoded data of the received signal of the non-target layer. When the write address W is supplied from the writing controller 182a, each of the first delay buffer 186a and the second delay buffer 186b stores the second decoded data in the area corresponding to the write address W. When the read address R is supplied from the reading controller 182b, each of the first delay buffer 186a and the second delay buffer 186b outputs the second decoded data stored in the area corresponding to the read address R to the multiplexer 188.

The multiplexer 188 generates the TS data by multiplexing the outputs of the first delay buffer 186a and second delay buffer 186b in the layer order (for example, in the order of the A layer and the B layer) indicated by the third layer information. The output (TS data) of the multiplexer 188 is supplied to the TS decoder 6 of FIG. 2.

According to the second embodiment, the capacities of the first delay buffer 186a and the second delay buffer 186b of FIG. 7 are smaller than that of the delay buffer of the first embodiment. Accordingly, compared with the first embodiment, the capacity of the buffer, which is necessary for reducing the PCR jitter when the TS data is decoded, can be reduced.

At least a portion of the error correcting decoder according to the above-described embodiments may be composed of hardware or software. When at least a portion of the error correcting decoder is composed of software, a program for executing at least some functions of the error correcting decoder may be stored in a recording medium, such as a flexible disk or a CD-ROM, and a computer may read and execute the program. The recording medium is not limited to a removable recording medium, such as a magnetic disk or an optical disk, but it may be a fixed recording medium, such as a hard disk or a memory.

In addition, the program for executing at least some functions of the error correcting decoder according to the above-described embodiment may be distributed through a communication line (which includes wireless communication) such as the Internet. In addition, the program may be encoded, modulated, or compressed and then distributed by wired communication or wireless communication such as the Internet. Alternatively, the program may be stored in a recording medium, and the recording medium having the program stored therein may be distributed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An error correcting decoder comprising:
a first error correction decoding module configured to perform a first error correction decoding to a received signal in accordance with a broadcasting system;
an interleaving module configured to rearrange a data array of an output of the first error correction decoding module in a second order, the data array being ordered in a first order which is reverse to the second order;
a delay module configured to delay the received signal by a processing time of the first error correction decoding module;
a second error correction decoding module configured to perform a second error correction decoding to an output of the interleaving module and an output of the delay module; and
a corrector configured to correct a delay of an output of the second error correction decoding module based on a packet position defined by the broadcasting system.

2. The decoder of claim 1, wherein the first error correction decoding module comprises:
a first soft-decision Viterbi decoder configured to perform convolution decoding to the received signal;
a first deinterleaver configured to rearrange a data array of an output of the first soft-decision Viterbi decoder in the first order; and
a first hard-decision Reed-Solomon decoder configured to perform the hard-decision Reed-Solomon decoding to an output of the first deinterleaver to generate first decoded data and a syndrome,
wherein the interleaving module rearranges a data array of an output of the first soft-decision Viterbi decoder in the second order,
wherein the second error correction decoding module comprises:
a second soft-decision Viterbi decoder configured to perform the convolution decoding to the output of the interleaving module and the output of the delay module;
a second deinterleaver configured to rearrange a data array of an output of the second soft-decision Viterbi decoder in the second order; and
a second hard-decision Reed-Solomon decoder configured to perform the hard-decision Reed-Solomon decoding to an output of the second deinterleaver to generate second decoded data, and
wherein the corrector corrects a delay of the second decoded data.

3. The decoder of claim 2, wherein
the first hard-decision Reed-Solomon decoder further generates first layer information indicating a data array of the first decoded data,
the second hard-decision Reed-Solomon decoder further generates second layer information indicating a data array of the second decoded data, and
the corrector generates third layer information using the first layer information and the second layer information, and corrects the delay of the second decoded data using the third layer information.

4. The decoder of claim 3, further comprising a layer selector configured to select target layer to which the second error correction is performed in the received signal comprising a plurality of layers,
wherein the second error correction decoding module performs the second error correction decoding to data of the target layer.

5. The decoder of claim 4, wherein the layer selector selects the layer having the highest carrier modulation as the target layer.

6. The decoder of claim 5, wherein the corrector comprises:
a first delay buffer configured to delay the second decoded data of the target layer;
a second delay buffer configured to delay the second decoded data of a non-target layer; and
a multiplexer configured to generate transport stream data by multiplexing an output of the first delay buffer and an output of the second delay buffer in a layer order indicated by the third layer information.

7. The decoder of claim 4, wherein the corrector comprises:
a first delay buffer configured to delay the second decoded data of the target layer;
a second delay buffer configured to delay the second decoded data of a non-target layer; and
a multiplexer configured to generate transport stream data by multiplexing an output of the first delay buffer and an output of the second delay buffer in a layer order indicated by the third layer information.

8. The decoder of claim 2, further comprising a layer selector configured to select target layer to which the second error correction is performed in the received signal comprising a plurality of layers,
wherein the second error correction decoding module performs the second error correction decoding to data of the target layer.

9. The decoder of claim 8, wherein the layer selector selects the layer having the highest carrier modulation as the target layer.

10. The decoder of claim 9, wherein the corrector comprises:
a first delay buffer configured to delay the second decoded data of the target layer;
a second delay buffer configured to delay the second decoded data of a non-target layer; and
a multiplexer configured to generate transport stream data by multiplexing an output of the first delay buffer and an output of the second delay buffer in a layer order indicated by the third layer information.

11. The decoder of claim 8, wherein the corrector comprises:
a first delay buffer configured to delay the second decoded data of the target layer;
a second delay buffer configured to delay the second decoded data of a non-target layer; and
a multiplexer configured to generate transport stream data by multiplexing an output of the first delay buffer and an output of the second delay buffer in a layer order indicated by the third layer information.

12. The decoder of claim 2, wherein the second hard-decision Reed-Solomon decoder further generates layer information indicating a data array of the second decoded data,
wherein the corrector comprises:
a plurality of delay buffers configured to delay the second decoded data, a number of the delay buffers being equal to a number of layers of the received signal;

a plurality of counters corresponding to the delay buffers, each counter configured to count delay time of the delay buffer, corresponding thereto, a number of counters being equal to the number of the delay buffers; and a multiplexer configured to generate transport stream by multiplexing outputs of the delay buffers in a layer order indicated by the layer information.

13. The decoder of claim 1, further comprising a layer selector configured to select target layer to which the second error correction is performed in the received signal comprising a plurality of layers, wherein the second error correction decoding module performs the second error correction decoding to data of the target layer.

14. The decoder of claim 13, wherein the layer selector selects the layer having the highest carrier modulation as the target layer.

15. The decoder of claim 14, wherein the corrector comprises:

a first delay buffer configured to delay the second decoded data of the target layer;

a second delay buffer configured to delay the second decoded data of a non-target layer; and a multiplexer configured to generate transport stream data by multiplexing an output of the first delay buffer and an output of the second delay buffer in a layer order indicated by the third layer information.

16. The decoder of claim 13, wherein the corrector comprises:

a first delay buffer configured to delay the second decoded data of the target layer;

a second delay buffer configured to delay the second decoded data of a non-target layer; and a multiplexer configured to generate transport stream data by multiplexing an output of the first delay buffer and an output of the second delay buffer in a layer order indicated by the third layer information.

17. A receiving system comprising:

a tuner configured to receive an orthogonal frequency division multiplexing signal transmitted in a layer transmission manner from a base station;

an analog to digital converter (ADC) configured to convert an output of the tuner into a digital signal;

a demodulator configured to demodulate an output of the ADC;

a time interleaver configured to perform time-interleaving processing to an output of the demodulator;

a first error correction decoding module configured to perform a first error correction decoding to an output of the time interleaver;

an interleaving module configured to rearrange a data array of an output of the first error correction decoding module in a second order, the data array being ordered in a first order which is reverse to the second order;

a delay module configured to delay the output of the time interleaver by a processing time of the first error correction decoding module;

a second error correction decoding module configured to perform a second error correction decoding to an output of the interleaving module and an output of the delay module; and a corrector configured to correct a delay of an output of the second error correction decoding module based on a packet position defined by the broadcasting system employed by the base station.

18. The system of claim 17, wherein the first error correction decoding module comprises:

a first soft-decision Viterbi decoder configured to perform convolution decoding to the received signal;

a first deinterleaver configured to rearrange a data array of an output of the first soft-decision Viterbi decoder in the first order; and a first hard-decision Reed-Solomon decoder configured to perform the hard-decision Reed-Solomon decoding to an output of the first deinterleaver to generate first decoded data and a syndrome, wherein the interleaving module rearranges a data array of an output of the first soft-decision Viterbi decoder in the second order, wherein the second error correction decoding module comprises:

a second soft-decision Viterbi decoder configured to perform the convolution decoding to the output of the interleaving module and the output of the delay module;

a second deinterleaver configured to rearrange a data array of an output of the second soft-decision Viterbi decoder in the second order; and a second hard-decision Reed-Solomon decoder configured to perform the hard-decision Reed-Solomon decoding to an output of the second deinterleaver to generate second decoded data, and wherein the corrector corrects a delay of the second decoded data.

19. The system of claim 18, wherein the first hard-decision Reed-Solomon decoder further generates first layer information indicating a data array of the first decoded data, the second hard-decision Reed-Solomon decoder further generates second layer information indicating a data array of the second decoded data, and the corrector generates third layer information using the first layer information and the second layer information, and corrects the delay of the second decoded data using the third layer information.

20. The system of claim 17, further comprising a layer selector configured to select target layer to which the second error correction is performed in the received signal comprising a plurality of layers, wherein the second error correction decoding module performs the second error correction decoding to data of the target layer.

* * * * *